United States Patent [19]

Schmidt

[11] 4,419,776
[45] Dec. 13, 1983

[54] BATHTUB ASSEMBLY FOR HANDICAPPED PERSONS

[76] Inventor: Peter Schmidt, D7989 Enkenhofen Gde.Argenbühl, Fed. Rep. of Germany

[21] Appl. No.: 382,536

[22] Filed: May 27, 1982

[30] Foreign Application Priority Data

Sep. 1, 1981 [DE] Fed. Rep. of Germany ....... 3134516

[51] Int. Cl.³ ............................................. A47K 3/12
[52] U.S. Cl. ........................................ 4/564; 4/495; 4/565; 4/566
[58] Field of Search ................... 4/564, 565, 566, 560, 4/563, 499, 495

[56] References Cited

U.S. PATENT DOCUMENTS

| | | | |
|---|---|---|---|
| 2,133,587 | 10/1938 | Stark | 4/566 |
| 2,725,578 | 12/1955 | Keller | 4/566 |
| 2,817,096 | 12/1957 | Roth | 4/579 |
| 3,106,723 | 10/1963 | Carpenter | 4/564 |
| 3,311,930 | 4/1967 | Bourke | 4/566 |
| 3,400,410 | 9/1968 | Sallinger | 4/564 |
| 3,435,466 | 4/1969 | Cheney | 4/566 |
| 3,477,069 | 11/1969 | Stiger | 4/566 |
| 3,935,600 | 2/1976 | Scribner | 4/495 |
| 4,254,517 | 3/1981 | Herman, Jr. | 4/566 |

*Primary Examiner*—Henry K. Artis
*Attorney, Agent, or Firm*—Angelo Notaro

[57] ABSTRACT

A bathtub assembly that can be raised and lowered has a bottom and a lift plate with scissors-like guide frames positioned between them, which said frames guide the lift plate vertically. Two collapsible hoses or bellows, made of material that bends but does not stretch, are sealed at the ends, one end being attached to the lift plate and the other to the bottom. The hoses or bellows 20, are connected by means of connection hoses and a manual valve to the house water supply line.

6 Claims, 14 Drawing Figures

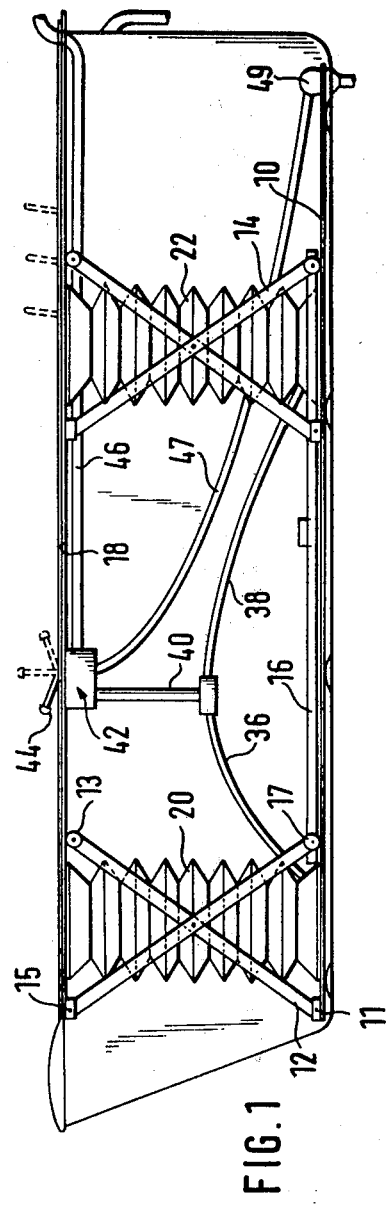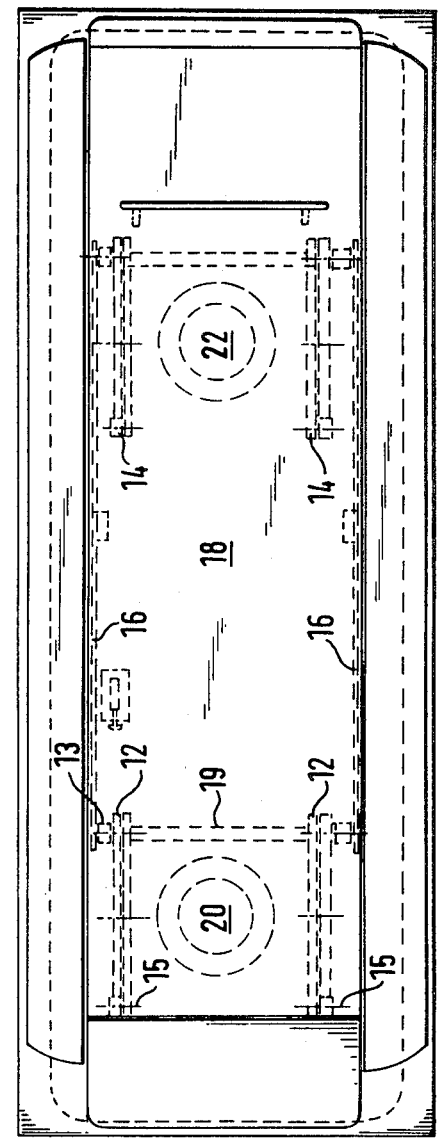

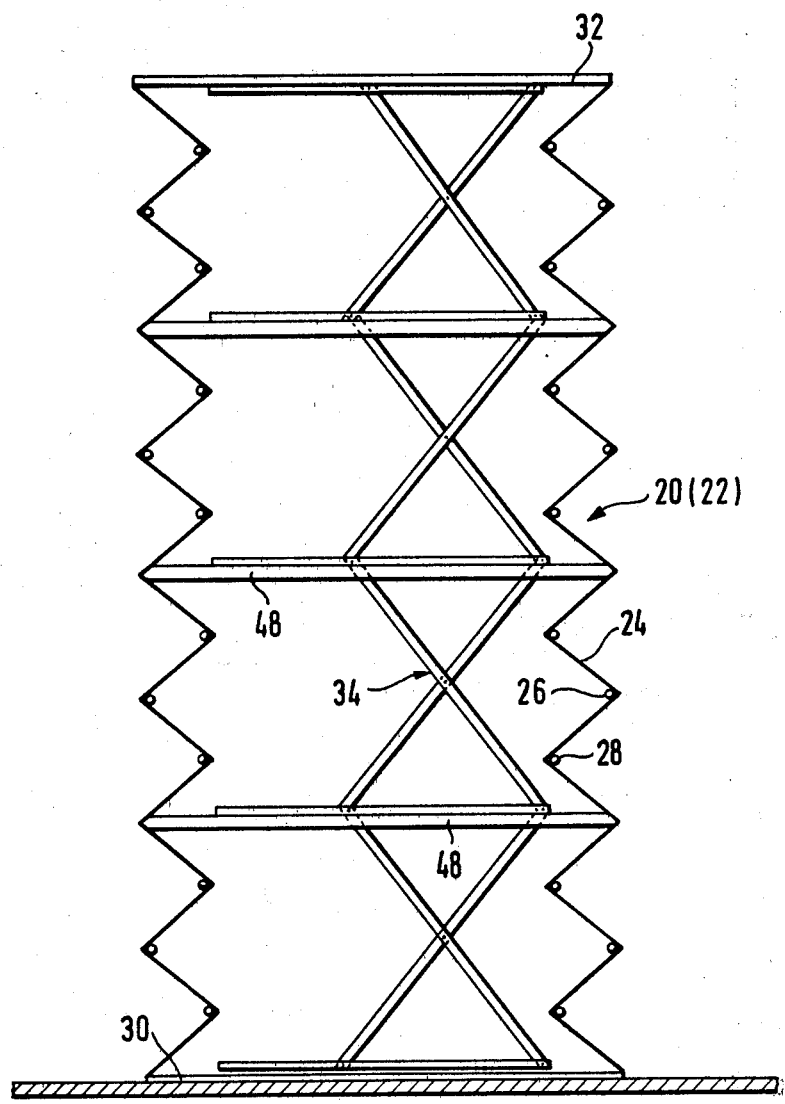

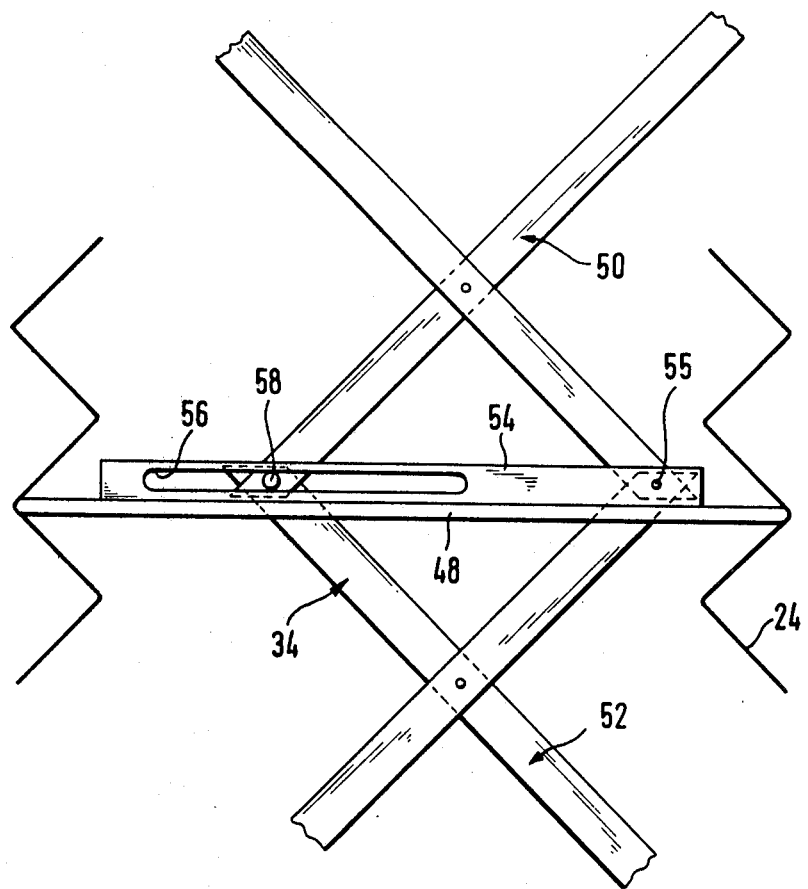

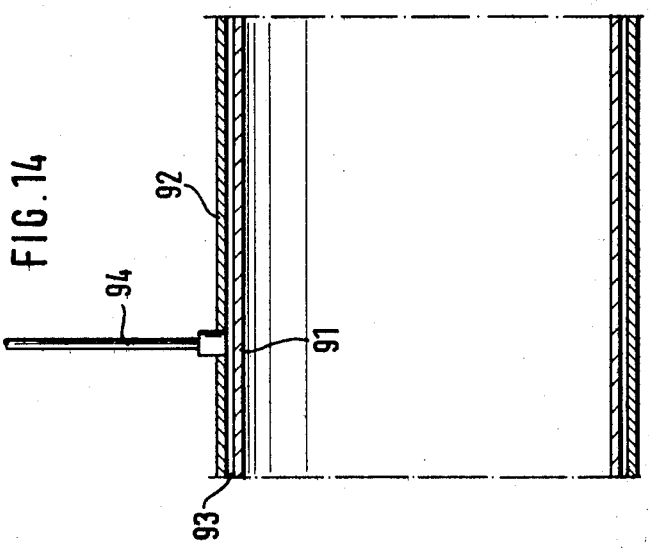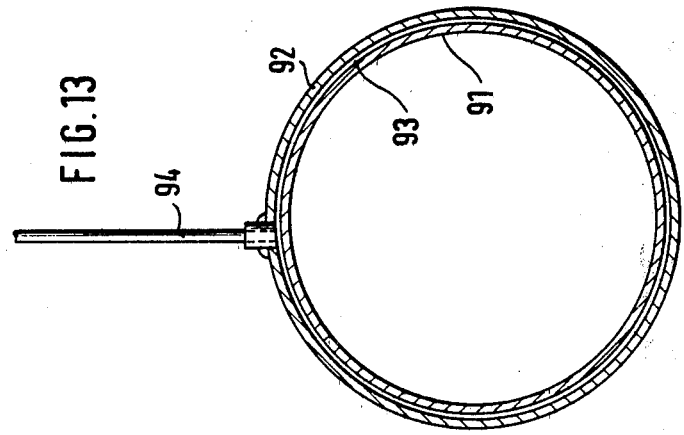

BATHTUB ASSEMBLY FOR HANDICAPPED PERSONS

BACKGROUND OF THE INVENTION

The invention concerns a bathtub assembly for handicapped persons, with a base, a lifting plate, a guide frame between them which consists of at least two scissors-like rocking lever sets and a pressure-operated lift for lifting the plate, and a manually-operated valve for controlling the lift.

Such a bathtub assembly is disclosed in U.S. Pat. No. 2,772,721. In accordance with the present invention the tub assembly can be inexpensively constructed, in technically simple manner and, at the same time, its handling can be improved.

This task is achieved by the invention in that the lift consists of at least one collapsible tube or bellows with closed ends, the wall of which bends but for the most part does not expand, which tube or bellows folds flat when the lifting plate is lowered, has a water connection, and is in essentially flat position after filling it has been filed with water.

In the bathtub assembly disclosed in U.S. Pat. No. 2,772,721, the lift has a pressure cylinder that is supplied by a pressure pump with a pressure medium. The cylinder is positioned in prone position on the bottom, and its branch rod fits on the guide frame. The pressure cylinder is supplied with a high pressure by means of the pump, because in the initial lifting only a very small operating force component in the direction of lift is available. In lowered position, the lift table is still at a considerable distance from the bottom because otherwise no vertical force component at all can be achieved in the initial extension of the cylinder. Thus little advantage can be taken of the depth of the tub. Also, the known assembly can be used only for sitting. Another disadvantage is that in the lifting motion the lift table moves horizontally as well as vertically.

SUMMARY OF THE INVENTION

The invention eliminates all these disadvantages. In lowered position, the lift table is only a few centimeters above the bottom. Instead of the expensive high-pressure pump and the expensive hydraulic cylinder, only an inexpensive tube is needed. This tube is connected to the household water supply by means of the valve. A water pressure of three bar is sufficient to lift the lift table faster than is the case with the state-of-the-art high-pressure pump. Thus, the lift according to the invention operates at low pressure. Similarly, a piece of ordinary fire hose with a diameter of about 8 cm. is sufficient to raise the lift table, even in the case of a heavy person. In flat position, the hose is filled with about 2.5 liters of water. Thus the lift according to the invention operates on a large-volume basis and hence at low pressure. The principal advantage is that the tube or bellows can lie so flat that it no longer influences the total height of the assembly, the result being a much better utilization of force in the initial raising from lowered position, since the lift table is already pressed upward by the water flowing into the tube or bellows.

Additional features and advantages of the invention can be deduced from the patent claims and the description of several embodiments.

BRIEF DESCRIPTION OF THE DRAWINGS

FIG. 1 shows a diagrammatic side view of a bathtub with the assembly in raised position;

FIG. 2 a plan view of the assembly according to FIG. 1;

FIG. 3 a diagrammatic sectional view through the lift;

FIG. 4 an enlarged depiction of a section of lift;

FIG. 13 a cross-sectional view of a double-walled tube used as a lift for the bathtub assembly; and FIG. 14 a longitudinal section through the tube according to FIG. 13.

DETAILED DESCRIPTION

Figure 5:
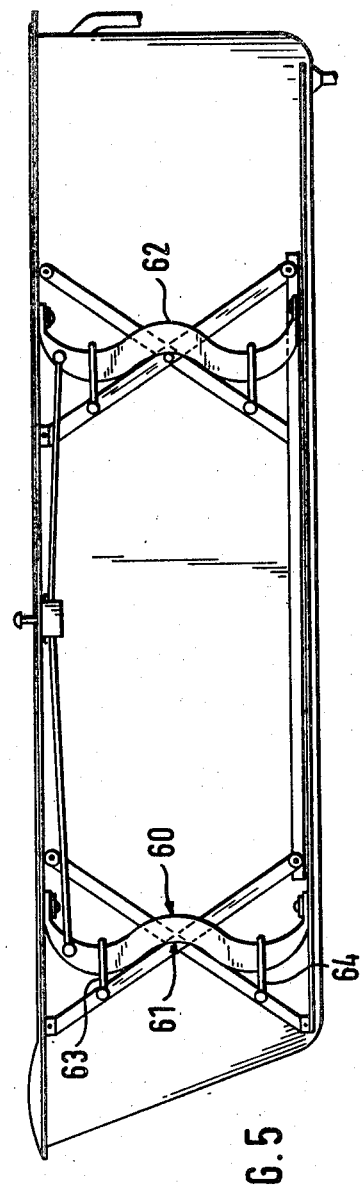
FIG. 5 a side view of a modified embodiment of an assembly.

The bathtub assembly includes of a bottom plate 10 that is slightly shorter than the length of a bathtub. Two rocking lever sets 12 are positioned at right angles at the front end of the bottom plate 10. Two identically shaped rocking lever sets 14 are positioned at a distance from the back end of the plate 10. All rocking levers are the same length. The rocking levers of each set of levers are jointed to one another at mid-length. One lever of each of lever sets 12, 14, has a swivel housing 11 fixed to the bottom, and at the other end a tread roller 13 to support a lift plate or table 18. The other rocking lever of the lever set has a swivel joint 15 fixed to the table at one end and a tread roller 17 at the other end, which rests on the bottom plate 10. The joints 11, 15 are installed vertically, and preferably joints 11, 15 of both swivel arm pairs 12, 12 are at right angles to the table plate 18. The same is true of swivel arm pair 14. This construction makes it possible for the lift table to move downward and upward, without side movement components at a precise right angle to the bottom plate 10.

The rocking levers with the bottom thread rollers 17 are connected, by means by longitudinal struts 16, with the corresponding rocking levers of the rear rocking lever set 14. The rocker levers with bottom thread rollers 17 are linked together in pairs by means of transverse axles 19. All four rocking lever sets thus work synchronously to move table 18 parallel to itself. In the area of the two front lever sets 12 there is a lift bellows 20, and in the area of the rear lever sets 14 there is a similarly constructed lift bellows 22. These lift bellows are collapsible bellows that are sealed top and bottom to discs 30, 32 (FIG. 3). The discs, in turn, are screwed to bottom 10 and table 18.

Each collapsible bellows consists of a casing 24 made a material that bends but does not stretch. On the outside folds there are rings 28, and on the inside folds rings 26 and prop rings 48 alternate. The prop rings are jointed to two parallel scissors grids 34 such that they operate precisely vertical manner while maintaining their parallel position. Each scissors grid consists of four rocking lever sets, with one rocking lever of one rocking lever set 50 being housed in a horizontal bar 54 so as to pivot on a pin 36, on which said pin another rocking lever of a lever set 52 positioned beneath it can pivot. The other rocking lever of lever set 50 has a joint pin 58, which is jointed to the other rocking lever of the bottom lever set 52. This pin 58 can slide in a longitudinal slot in bar 54. Each of the two scissors grids 34 has a bar 54 that is attached to the prop ring.

Each of the lift bellows 20, 22 has a water-system connection which is connected to a common hose 40 by means of hose pipes 36, 38. The common hose 40 leads to a housing of a valve 42 which is attached laterally under the plate 18. The plate has a slot through which an operating lever 44 projects upward. A water feed line 46 is connected to the valve housing, which leads under the plate out and upward to an end. This feed line 46 is connected to the household water supply line. A water outlet hose 47 is connected to the valve housing 42. The outlet hose ends in a bathtub stopper 49, said stopper being constructed in such manner that it communicates with the bathtub outlet pipe when inserted into the bathtub runoff opening.

In the position of the manual operating lever 44 shown in FIG. 1, the line 40 leading to the lift bellows 20, 22 is connected to the water inlet line 46, and the raising procedure, takes place. The lever 44 is then moved into vertical position, in which all lines 40, 46, 47, are closed. In the third position of the lever 44, indicated by the broken line, the line 40 is connected with the outlet hose 47, and the water flows out of bellows 20, 22 into the tub outlet, whereupon plate 18 falls.

Figure 6:
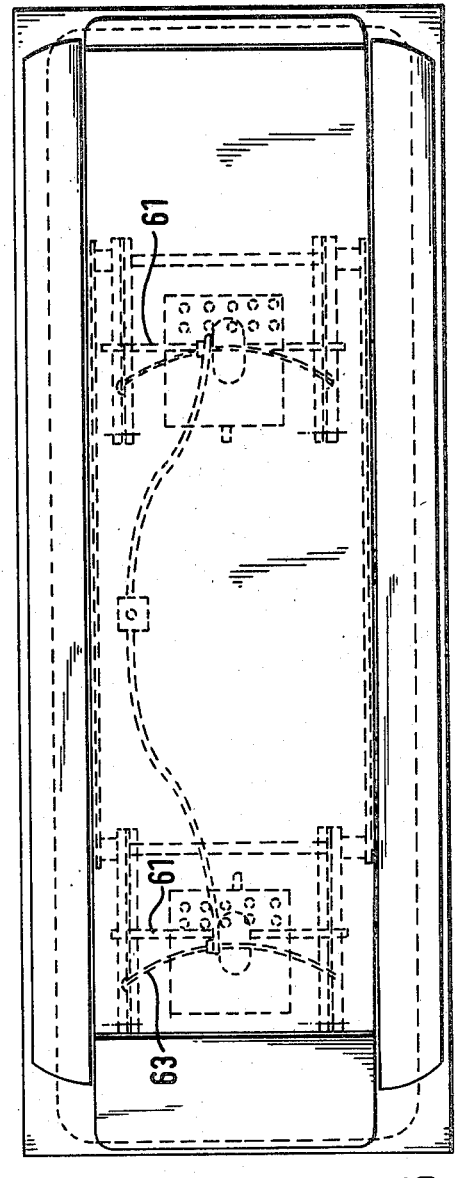
FIG. 6 a plan view of the assembly according to FIG. 5.

FIGS. 5 and 6 show a modified form of a bathtub assembly, in which only the lift differs from the embodiment hereinabove described. Lift bellows 20, 22 are replaced here by hoses 60, 62, also made of a material that can bend but not stretch, the ends of which are pressed flat and tightly sealed. The flat ends are screwed to the lift table and the bottom plate. The center joints of each two rocking lever sets are connected with each other by means of a rod 61, along one side of which hose 60, 62 travels. Two rubber bands 63, 64, which are attached to the rocking levers, try to draw the hose 60 in the opposite direction. When the table drops the hose 60 thereupon folds up in zigzag form.

Figure 7:
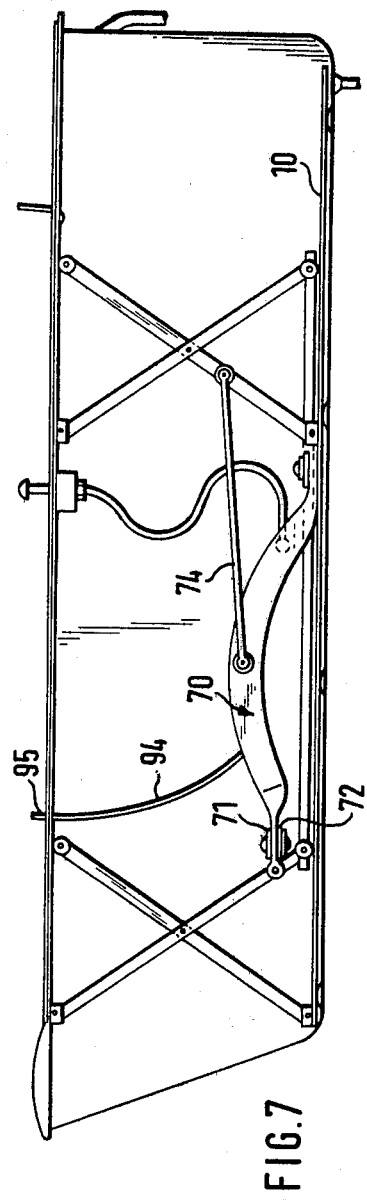
FIG. 7 a side view of another embodiment of an assembly.
Figure 8:
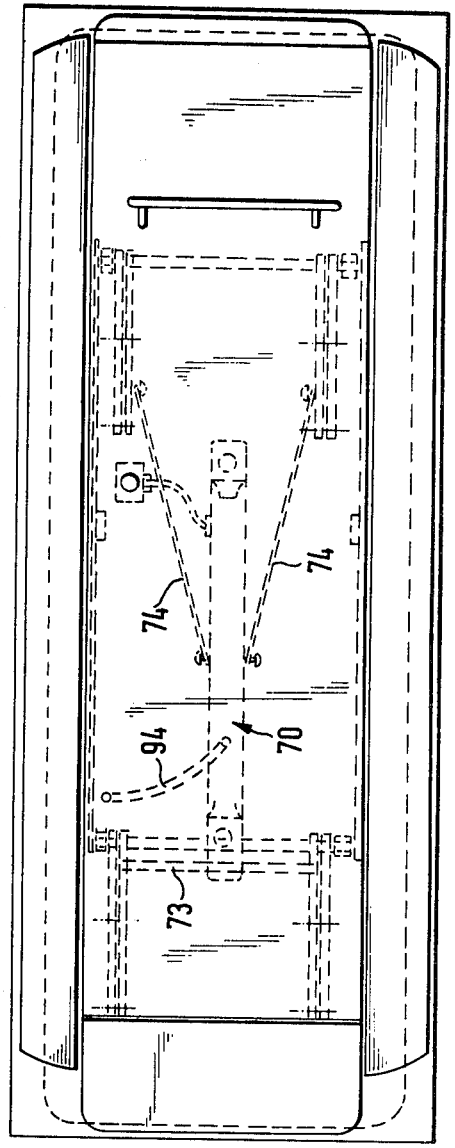
FIG. 8 a plan view of the assembly according to FIG. 7.

In the embodiment according to FIGS. 7 and 8, there is a hose 70 that corresponds to hose 60. This is a braided hose the ends of which are pressed flat, sealed, and screwed between two plates 71, 72. One plate set is clamped to a traverse bar 73, which connects two rocking levers of the two front rocking lever sets, while the other hose end is screwed longitudinally at intervals to the bottom 10. The attachment intervals are selected so that in maximum raised lift-table position the hose 70 is practically straight. In contrast to the embodiment according to FIGS. 5 and 6, in which hose 60 tries to assume a vertical position upon filling with pressure water, hose 70 assumes a horizontal position. Although only one hose 70 is provided in the embodiment according to FIGS. 7 and 8, it is understood that two parallel hoses adjacent to each other can just as well be used, as can two hoses lying one above the other, in which case, however, the upper hose is attached at one end to the underside of the table plate and the other end is attached to one of the rods, corresponding to rod 73, of the two other levers of these two lever sets. Two rubber bands 74, hung on fittings laterally attached to hose 70, draw the hose into the desired folded position when the table plate drops.

For hoses 60 and 70, sections of ordinary commercial fire hose can be used, which have a fabric casing that does not stretch. When these hoses are filled with water and placed under pressure, they assume a stable extended position.

Figure 9:
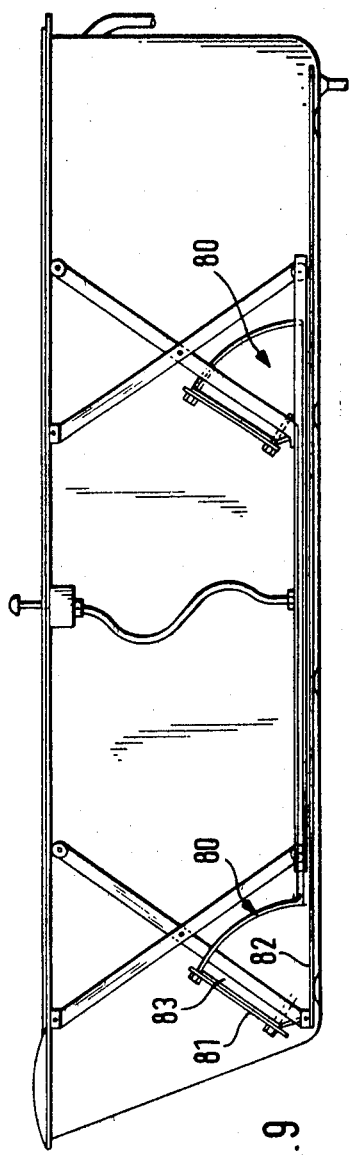
FIG. 9 a side view of another modified embodiment of a new bathtub assembly.
Figure 10:
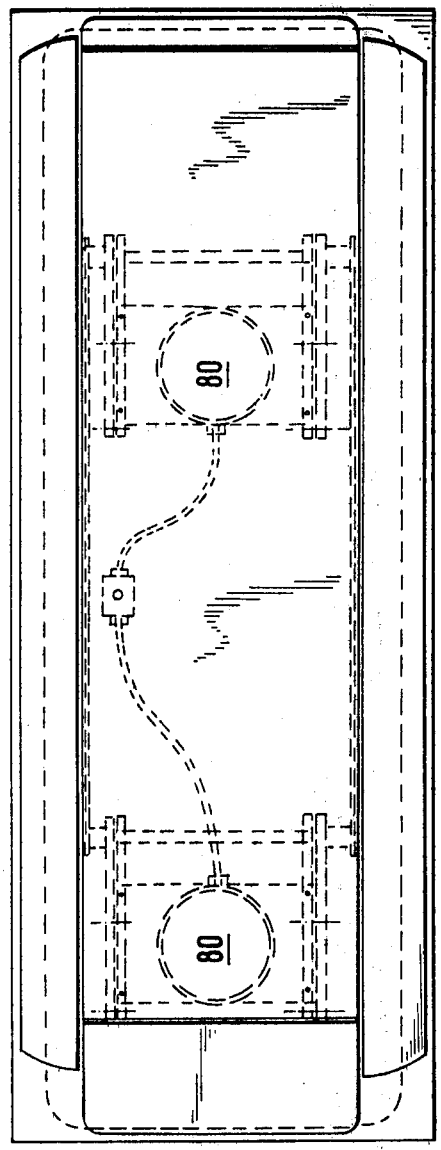
FIG. 10 a plan view of the assembly according to FIG. 9.

The embodiment according to FIGS. 9 and 10 uses two short hoses 80, which in the extended position shown have the form of a torus sector section. The sector angle is about 60°. The torus front sides are connected through rigid circular discs 81, 82, to which the hose 80 is tightly connected externally with straps. Disc 82 is screwed to the bottom plate, while top disc 81 is screwed to a crossbar 83, which in turn is bolted to two rocking levers of the rocking lever set. The swivel axis of these two rocking levers thereby lies approximately in the area of the imaginary torus axis.

Figure 11:
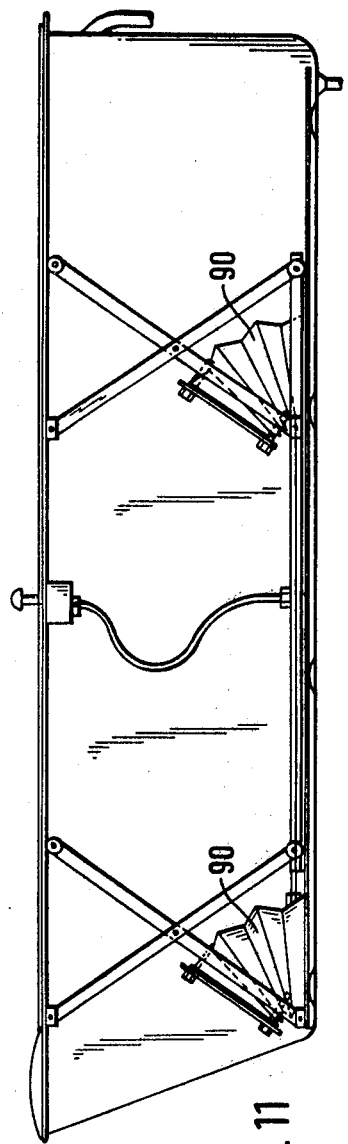
FIG. 11 a side view of another embodiment of a tub assembly.
Figure 12:
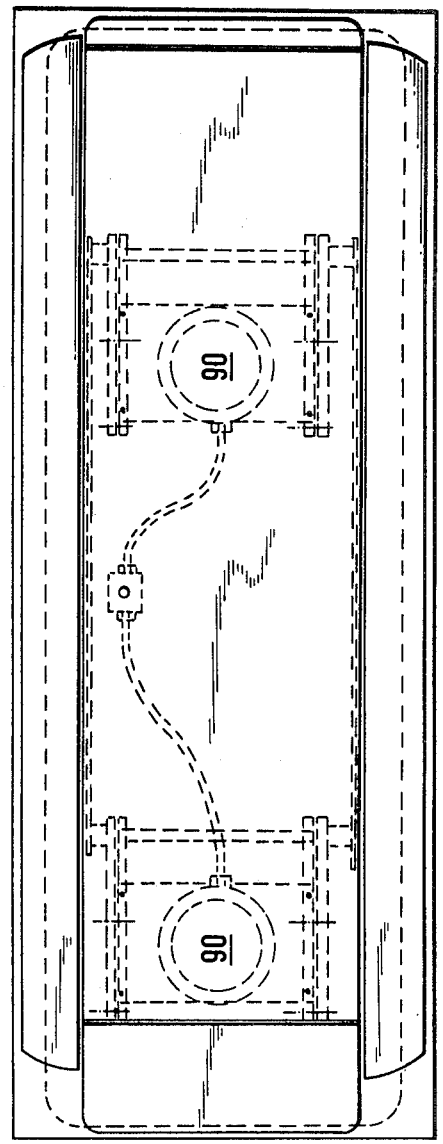
FIG. 12 a plan view of the tub assembly according to FIG. 11.

FIGS. 11 and 12 show an embodiment in which the torus-sector-shaped hoses have been replaced by such collapsible bellows 90. Both embodiments function in the same way, but the bellows 90 fold up when the table is dropped.

In all embodiments, the hoses or bellows consist of an inner casing 91 and a concentric outer casing 92 as shown in FIGS. 13 and 14. Both casings are made of the same material. An hermetically-sealed torus 93 is formed between hoses 91, 92, into which torus a signal line 94 opens, which signal line leads to the table plate, as illustrated in FIGS. 7 and 8, and ends at the top of the plate in a outlet nozzle 95. The double-walled hose reinforces the security. If the inner hose should leak, pressure water enters the torus 93 and is discharged in a fine stream that is visible to the user.

I claim:

1. In a bathtub assembly for handicapped persons of the type having a bottom plate, a lifting plate, and a guide means intermediate the bottom plate and the lifting plate, the guide means being of the type having at least two scissors-like rocking lever sets, lift means which can be filled with water for lifting the lifting plate, and a manually-operated valve connectable with and responsive to a household water supply for controlling the lift means, the lift means having at least one collapsible hollow body closed at the ends, one end fastened at the bottom plate and the other end fastened to one of the lifting plate and the guide frame, the collapsible hollow body having a wall operable for folding with minimal stretch and which folds flat when the lifting plate is lowered, the hollow body having a water connection and being inflated by filling with water, the improvement wherein the guide means comprises pairs of identical guide frames connected to each end of the bottom plate and each end of the lifting plate, a longitudinal strut jointed to one end of each rocking lever of one guide frame of one pair of guide frames and to one longitudinally opposite end of a rocking lever of another guide frame of the opposite pair of guide frames, transverse axles jointed to transversely opposite ends of a rocking lever of each guide frame of each pair of identical guide frames, said struts and axles being mounted parallel to the bottom plate, and said struts and axles being operable to synchronously move the lifting plate parallel to itself; and wherein the hollow body comprises a hose having a diameter of about three inches, and means attached to the hose for folding the hose into zigzag form when the lifting plate is lowered.

2. The improved bathtub assembly as claimed in claim 1, wherein the manually-operated valve comprises a valve housing attached under the lifting plate, said valve housing having a manual-operating lever projecting upwardly through an opening in the lifting plate, the lever having two operating positions; and further comprising a water inlet hose, a water outlet hose, and a connection hose, the connection hose being connected to the hollow body and the valve housing to establish fluid communication therebetween.

3. The improved bathtub assembly as claimed in claim 2, wherein the bathtub includes a water outlet opening, and a stopper plug that closes the water outlet opening of the bathtub, and wherein the water outlet hose is operatively connected to the stopper plug.

4. The improved bathtub assembly as claimed in claim 1, wherein the hollow body comprises a hose having concentric double walls, both walls consisting essentially of the same material, and said walls being spaced from each other to define a chamber, and wherein the chamber between the two walls is hermetically sealed.

5. The improved bathtub assembly as claimed in claim 4, wherein a signal line ends in the closed chamber.

6. The improved bathtub assembly as claimed in claim 5, wherein the other end of the signal line ends at the upper side of the lifting plate.

* * * * *